United States Patent
You et al.

(10) Patent No.: US 8,648,534 B2
(45) Date of Patent: Feb. 11, 2014

(54) MICROWAVE ANTENNA FOR GENERATING PLASMA

(75) Inventors: Hyun Jong You, Daejeon (KR); Soo Ouk Jang, Daejeon (KR); Yong Ho Jung, Seoul (KR); Bong Ju Lee, Daejeon (KR)

(73) Assignee: Korea Basic Science Institute, Daejeon-Si (KR)

( * ) Notice: Subject to any disclaimer, the term of this patent is extended or adjusted under 35 U.S.C. 154(b) by 166 days.

(21) Appl. No.: 13/392,238

(22) PCT Filed: Jul. 6, 2010

(86) PCT No.: PCT/KR2010/004406
§ 371 (c)(1),
(2), (4) Date: Feb. 24, 2012

(87) PCT Pub. No.: WO2011/025143
PCT Pub. Date: Mar. 3, 2011

(65) Prior Publication Data
US 2012/0153825 A1    Jun. 21, 2012

(30) Foreign Application Priority Data

Aug. 24, 2009  (KR) ......................... 10-2009-0078248
Nov. 30, 2009  (KR) ......................... 10-2009-0117397

(51) Int. Cl.
*H05H 1/46*  (2006.01)

(52) U.S. Cl.
USPC ................... 315/34; 315/111.41; 315/111.51

(58) Field of Classification Search
None
See application file for complete search history.

(56) References Cited

U.S. PATENT DOCUMENTS

| 4,562,439 | A  | * | 12/1985 | Peralta et al. .................... 342/81 |
| 5,342,472 | A  |   | 8/1994 | Imasahi et al. |
| 5,378,284 | A  | * | 1/1995 | Geisler et al. .......... 118/723 MR |
| 5,749,966 | A  | * | 5/1998 | Shates ............................. 117/79 |
| 5,767,628 | A  | * | 6/1998 | Keller et al. ............. 315/111.51 |
| 7,400,096 | B1 | * | 7/2008 | Foster et al. ............. 315/111.41 |
| 7,493,869 | B1 | * | 2/2009 | Foster et al. ........... 118/723 AN |
| 7,670,454 | B2 | * | 3/2010 | Ohmi et al. .............. 156/345.41 |

FOREIGN PATENT DOCUMENTS

| JP | 07-335162 | 12/1995 |
| KR | 10-0582787 | 5/2006 |
| KR | 10-0751740 | 8/2007 |

OTHER PUBLICATIONS

International Search Report mailed Jan. 25, 2011 for PCT/KR2010/004406.

* cited by examiner

*Primary Examiner* — Crystal L Hammond
(74) *Attorney, Agent, or Firm* — Lowe Hauptman & Ham, LLP

(57) ABSTRACT

The present invention relates to the new structure antenna to create the uniform large area plasma using microwave. The microwave antenna to create the plasma of present invention comprises the waveguide, main body of antenna and the coaxial structure connecting part which connects said waveguide and said main body of antenna electrically, the main body of antenna comprises the conductive block in donut shape forming multiple slots, and notches are formed between the multiple slots of the conductive block and multiple permanent magnets are inserted into the notches. The multiple slots can be formed by passing through the inside and outside of the conductive block and the multiple slots can be formed with repetitive square wave pattern.

16 Claims, 3 Drawing Sheets

MICROWAVE ANTENNA FOR GENERATING PLASMA

CROSS REFERENCE TO RELATED APPLICATION

This application claims the priority of Korean Patent Application No. 10-2009-0078248, filed on Aug. 24, 2009; and Korean Patent Application No. 10-2009-0117397, filed on Nov. 30, 2009 in the KIPO (Korean Intellectual Property Office). Further, this application is the National Phase application of International Application No. PCT/KR2010/004406, filed on Jul. 6, 2010, which designates the United States and was published in Korean.

TECHNICAL FIELD

The present invention relates to the microwave antenna to create the uniform large area plasma. More particularly, present invention relates to the microwave antenna wherein energetic electrons are distributed evenly throughout the entire antenna due to the direct installation of the permanent magnet on the antenna and the ionized plasma by said energetic electrons creates the plasma with uniform axisymmetry.

In general, the ECR (Electronic Cyclotron Resonance) plasma source is very effective for the operation and resonance range of the plasma to expand to the low pressure range (for example, $10^{-4}$ Torr)

In addition, the diversified plasma processing such as the etching and thin film growth using the plasma requires the plasma creation source in larger area to meet the limit characteristics and yield ratio which are requested in the industry. In addition, the large size plasma shall equip the uniformity in its distribution at the same time.

In relation to this, the lisitano coil which is the circular shape of the lisitano antenna is an effective antenna structure to create the corresponding large area plasma because the coil diameter could be adjusted into the required size regardless of the magnitude of the wavelength without limiting its diameter to the magnitude of the wavelength of the supplied wave.

However, the lisitano coil has been regarded as in appropriate for the antenna for the large area uniform plasma source due to the weak points such as i) nonaxisymmetry in plasma distribution (profile), and ii) limit to the supply power due to the use of non-cooling coaxial cable.

DETAILED DESCRIPTION ON THE INVENTION

Technological Task

Consequently, present invention is to provide the microwave antenna to create the uniform large area plasma with excellent axisymmetry in plasma distribution and less supply of power in consideration of the aforesaid problems.

Solution for the Task

A microwave antenna to create the plasma according to an embodiment of present invention comprises a waveguide, a main body of antenna and a connecting part wherein connecting the waveguide and antenna main body electrically. The body of the antenna comprises the conductive blocks in donut shape formed with multiple slots wherein forming the notches between the multiple slots of the conductive block and multiple permanent magnets are inserted into the notches. The main body of antenna comprising a donut shaped conductive block forming multiple slots wherein notches are formed in between the multiple slots of the conductive block wherein multiple permanent magnets are inserted into the notches.

The microwave antenna of present invention to create the plasma wherein the multiple slots are formed by passing through the internal and external part of the conductive blocks.

The microwave antenna of present invention to create the plasma wherein the main body of antenna comprises the cover to curb the deviation of the permanent magnet to outside.

The microwave antenna of present invention to create the plasma wherein the multiple slots are formed with repetitive square wave pattern.

The microwave antenna of present invention to create the plasma wherein the height direction length of the conductive block and the circumferential direction length of the multiple slots are formed with ½ of the wave decided by the use frequency wherein the multiple slots are shorted at the terminal part.

The microwave antenna of present invention to create the plasma wherein the multiple permanent magnets are inserted into the notches formed between the multiple slots and are aligned its upper side to be N pole and bottom side to be S pole, otherwise its upper side to be S pole and bottom side to be N pole.

The microwave antenna of present invention to create the plasma wherein the main body of antenna comprises a connecting part to the external conductive block and a connecting part to the internal conductive block which connect to the coaxial structure connecting part electrically in the antenna main body.

The microwave antenna of present invention to create the plasma wherein the movement of the energetic electrons due to the gradient and curvature of the magnetic field
is governed by the following equation, $$\underline{V}_d = \frac{m_e}{e}\left(V_\parallel^2 + \frac{1}{2}V_\perp^2\right)\frac{B \times R_c}{B^2 R^2}$$

Here, $\underline{V}_d$ is a vector of the drift velocity,
$V_\parallel$ is a velocity vector for magnetic field direction,
$V_\perp$ is a velocity which is perpendicular to the magnetic field,
$B^i$ is a magnetic field vector,
$R_c$ is a magnetic field curvature vector.

The microwave antenna of present invention to create the plasma comprises
an internal conductive block wherein the coaxial structure connecting part comprising a large diameter coaxial structure; an external conductive block allocating to the external part of the internal conductive block; and a ceramic insulation which covers the a part of the internal conductive block.

The microwave antenna of present invention to create the plasma further comprises a cooling channel to cool the internal and external conductive block in the coaxial structure connecting part.

The microwave antenna of present invention to create the plasma further comprises an antenna main body connecting part in the coaxial structure connecting part.

The microwave antenna of present invention to create the plasma wherein the internal conductive block is inserted into the waveguide and power is transmitted by coupling of the microwave inside the waveguide in coaxial structure.

The Effect of the Invention

According to present invention, permanent magnets are directly installed on the antenna and the energetic electrons which are created by ECR are distributed throughout entire microwave antenna due to the gradient and curvature of the magnetic, and the effect to create the plasma with uniform large area and uniform axisysmetry is obtained through ionizing the surrounded neutral particles by energetic electrons again.

BRIEF EXPLANATION ON THE DRAWING

THE BEST EMBODIMENT FOR THE INVENTION

Figure 1:
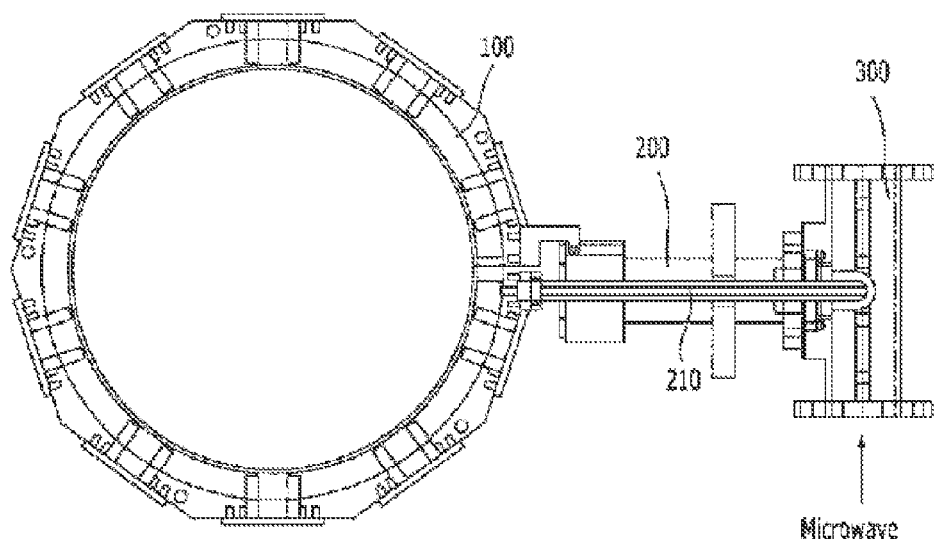
FIG. 1 is the side view diagram showing the microwave antenna to create the plasma according to present invention.

The particular structure or the functional explanation is suggested only for the purpose of explaining the embodiment depending on the concept of present invention and the embodiments according to the concept of present invention can be performed in various patterns and it shall not be interpreted to be limited to the embodiments explained in this specification or the application.

The particular embodiments are listed as examples on the drawing and they are explained in this specification and application in detail because the diversified modifications can be made on the embodiments for the concept of present invention and they can take in various patterns. However, the embodiments for the concept of present invention are not to be limited to a certain disclosure pattern and it shall be understood to include every change, equivalencies and the alternatives which are included in the range of the idea and technology of present invention.

The terminologies of the $1^{st}$ and/or the $2^{nd}$ can be used to explain many constituent elements, but the above constituent elements are not limited to the above terminologies. The above terminologies can be named only for telling one constituent element from the other constituent elements, for example, the $1^{st}$ constituent element can be named for the $2^{nd}$ constituent elements without deviating from the range of the right according to the concept of the invention, similarly, the $2^{nd}$ constituent element can be named as the $1^{st}$ constituent element.

When a certain constituent element is "connected" or "contacted" to another constituent element, it can be connected or contacted to another constituent element, but it shall be understood that there might be another constituent element in the middle. On the other hand, when a certain constituent element is "directly connected" or "directly contacted" to another constituent element, it shall be understood that there must be no existence of another constituent element in the middle. The other expressions to explain the relation among the constituent elements, i.e. "~ in between", "just ~ in between" or "adjacent to ~" and "directly adjacent to ~" shall be understood in the same way.

The terminologies used in this specification are used to explain the particular embodiment only and it is a not an intention to limit present invention. The expression for singular shall include the plural meaning unless otherwise interpreted clearly in the context. The terminologies of "include" or "have" in this specification is to define the existence of the characteristics, figures, stage, motion, constituent element, part or its combination, and it shall be understood not as excluding the existence and the additional possibilities of one or more other characteristics, figure, stage, motion, constituent element, part or its combination.

The every terminology used herein including the technical and scientific terminologies has the same meaning with the general understanding by the person with general knowledge in the technical part where present invention is categorized unless otherwise defined. The terminologies defined in the dictionary which are used generally shall be interpreted as to have the same meaning with context of the related technology and it shall not be interpreted as ideal or excessively formative meaning unless otherwise clearly defined herein.

The details of present invention can be explained by explaining the desirable embodiment of present invention by referring the attached drawing. The same marks for the reference suggested on each drawing means the same sub material.

Figure 2:
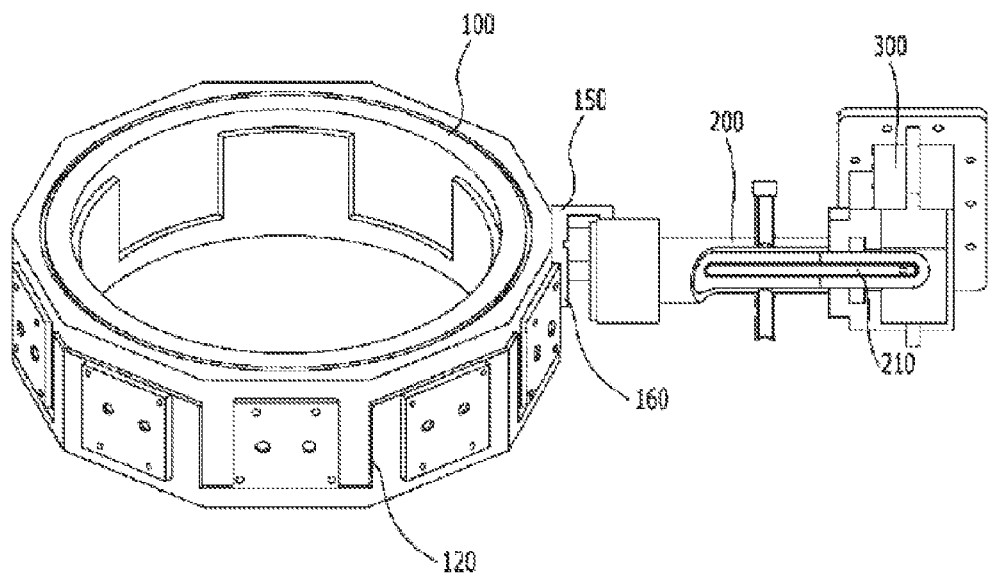
FIG. 2 is the cross sectional diagram of microwave antenna to create the plasma shown in FIG. 1.

FIG. 1 is the side view diagram on the microwave antenna to create the plasma according to present invention, and FIG. 2 is the cross sectional diagram of microwave antenna to create the plasma of present invention shown in FIG. 1. As it is shown in the drawing, microwave antenna to create the plasma of present invention comprises the main body of antenna (100), waveguide (300) and coaxial structure connecting part (200) connecting the waveguide and main body of antenna electrically. The main body of antenna (100) comprise donut shaped conductive block (110) with multiply formed slots (120), and notches (170) are formed between the multiple slots on the conductive block, and multiple permanent magnets (130) are inserted into above notches (17). The multiple slots (120) are formed by passing the internal and external sides of the conductive blocks (Refer to FIG. 5) and it is formed in shape of square wave (A shape of pattern which descending vertically and extended to the circumferential direction and ascending vertically and extended to the circumferential direction again and descending vertically again, ⊓⊔⊓ shape. (refer to FIG. 2 and FIG. 4)

Figure 4:
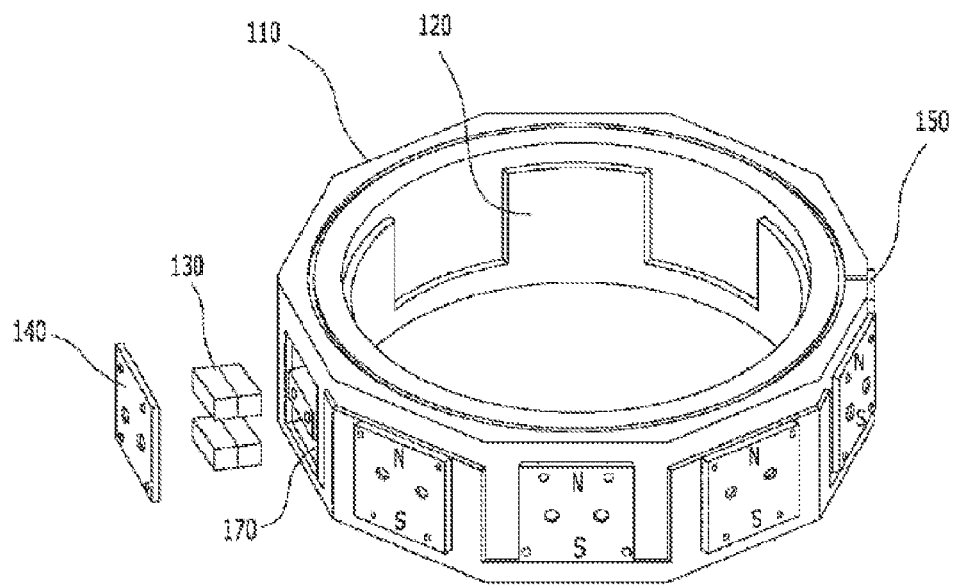
FIG. 4 is the schematic partial exploded side view of the main body of antenna shown in FIG. 2.

As it is depicted in FIG. 4, the notches (170) wherein the permanent magnets are inserted are formed between the multiple slots (120) formed on the conductive block (110) of main body of antenna (100) and the cover (140) can be attached on the notches (170) for the permanent magnets (130) not to be taken out. For example, the cover (140) can be made of steel. The length of the height direction and circumferential direction of the conductive block of the multiple slots (120) is formed to be ½ of the wavelength decided by the use frequency. The multiple slots (120) are shorted at the terminal point.

The multiple permanent magnets (130) are inserted into the notches (170) formed said conductive block (110), and the outer upper side of the main body of antenna (100) can be aligned for its upper side to be N pole and bottom side to be S pole. On the contrary, the outer upper side of the main body of antenna (100) can be aligned for its upper side to be N pole and bottom side to be S pole.

Figure 3:
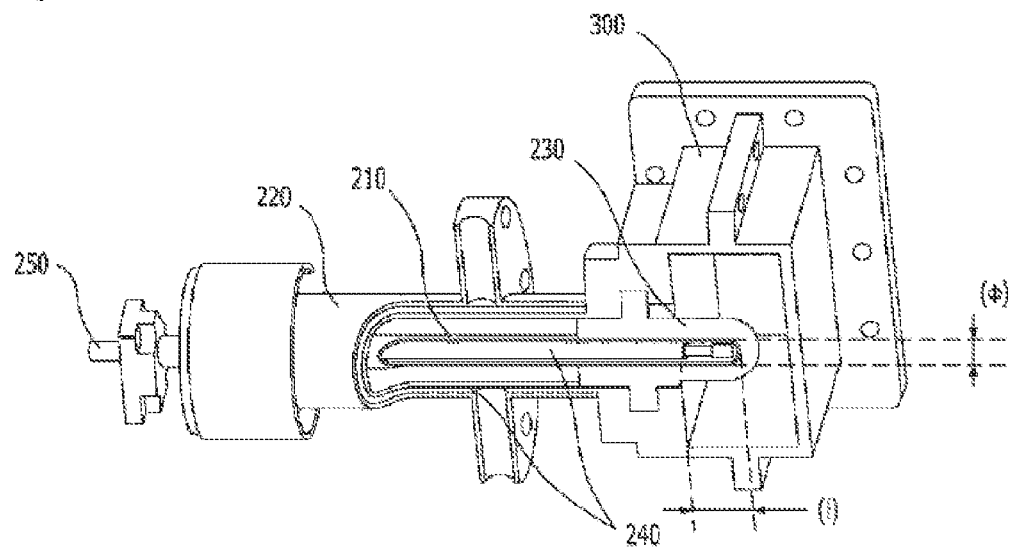
FIG. 3 is the schematic partial cross sectional diagram of the coaxial structure connecting part and waveguide shown in FIG. 2.

In continuation, by referring from FIG. 1 to FIG. 3, the coaxial structure connecting part (200) of microwave antenna to create the plasma according to present invention is explained (200).

FIG. 3 is a schematic partial cross sectional diagram of the coaxial structure connecting part and waveguide shown in FIG. 2. The main body of antenna (100) of present invention is connected to the coaxial structure connecting part (200) electrically by the external conductive block connecting part (150) and internal conductive block connecting part (160). The antenna connecting part (250) in coaxial structure connecting part (200) is connected to the main body of antenna (100).

As it is depicted in FIG. 3, the external conductive block (220) is allocated at outside of internal conductive block (210). The coaxial structure connecting part (200) comprises the large diameter coaxial structure, the internal conductive block (210), external conductive block (220) and ceramic insulator (230) which covers a part of the internal conductive block. The sufficient power can be supplied because the large diameter coaxial structure is used as shown in the above. In addition, as shown in the above, the power connection structure of antenna of present invention does not need the expensive feedthrough which is used for combination of the insulator-conductor and heat vulnerable finishing structure (sealing) (For example, O rings and etc) because the terminal part of the internal conductive block (210) inserted into the waveguide (300) is wrapped with the ceramic insulator (230)

In addition, the coaxial structure connecting part (200) can comprise additionally the cooling channel (24) which cools the internal conductive block (210), external conductive block (220). The cooling channel (240) can comprise the water cooling channel with circulating water. As it is explained, when the coaxial structure connection part (200) comprises the cooling channel, the problem of destroying the coaxial cable or feedthrough by the heating of the conduction and dielectric loss in the conventional coaxial cable. The cooling channel (240) can be realized with the forced cooling type without feedthrough because it is formed at the exterior trim of the internal conductive block to cool the internal conductive block (210) and external conductive block (220).

In addition, the internal conductive part (210) of the coaxial structure connecting part (200) is inserted into the waveguide (300) and the microwave inside the waveguide is coupled with coaxial structure. The diameter (Φ) and inserting length (l) of the internal conductive block shall be adjusted properly for the effective coupling of the internal conducive body (210) and the waveguide (300) (Refer to FIG. 3).

In addition, the coaxial structure connecting part (200) comprises the antenna connecting part (250).

On the other hand, the microwave electric current supplied to the coaxial structure connecting part (200) flows to the internal conductive block connecting part (160) of the main body of antenna via the internal conductive block (210). Again, the microwave electric current flows along the square wave shaped slot (120) formed on the main body of antenna and goes out through the external conductive block (220). The electric current flow formed inside the antenna in such manner creates the electric field to create plasma inside the antenna.

According to such procedure, the waveguide and the coaxial structure connecting part are connected directly with the structure (namely, a coupling structure with inserting the internal conductive block (210) of coaxial structure connecting part into the waveguide (300)) of direct coupling for supplied power from the waveguide to the coaxial structure connecting part (200), and it is forcibly cooled together with lisitano coil by the water.

The rectangular shape cross section of WR340 specification can be used for the waveguide (300).

In continuation, the role of the microwave antenna to create the plasma according to present invention is explained.

As the microwave antenna to create the plasma of present invention is made as described in the above, the array of the permanent magnets (130) inserted into the formed notches (170) between the slots (120) of the conductive block (110) of main body of antenna delivers the power (created by ECR) from the gradient and curvature of the magnetic field to the energetic electrons. In addition, the powered energetic electrons which play the main role for plasma creation contributes to ionization while they makes drift revolution along the inner wall of antenna, and the axisymetry of the plasma is acquired and the plasma axisymetry can be achieved through the drift circulation of the energetic electrons.

Figure 5:
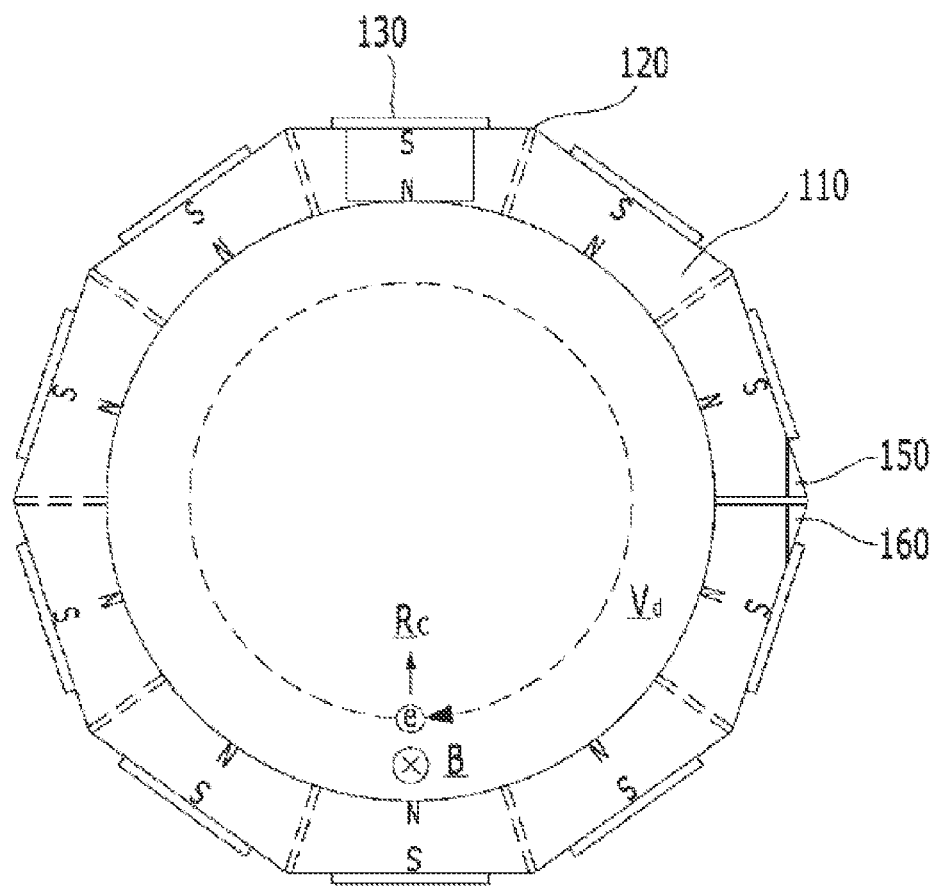
FIG. 5 is the diagram for explaining the movement (Vd) of energetic electrons by the gradient and curvature of the magnetic field inside the main body of microwave antenna to create the plasma.

FIG. 5 is the drawing for explaining the movement (Vd) of energetic electrons due to the gradient and curvature of the magnetic field inside the main body of antenna. As it is shown in the drawing, the array of the permanent magnets delivers the power (Created by ECR) from the gradient and curvature of the magnetic field to the energetic electrons. Accordingly, the powered energetic electrons contribute to the ionization while they make drift revolution along the circumferential direction and the plasma created in such procedure achieves the effective axisymmetry.

In addition, the movement of the energetic electrons due to the gradient and curvature of the magnetic field is $$\underline{V}_d = \frac{m_e}{e}\left(V_\parallel^2 + \frac{1}{2}V_\perp^2\right)\frac{\underline{B}\times \underline{R}_c}{B^2 R^2}$$

Here, $\underline{V}_d$ is a vector of the drift velocity, $V_\parallel$ is a velocity vector for magnetic field direction,
$V_\perp$ is a velocity which is perpendicular to the magnetic field, $\underline{B}$ is a magnetic field vector, and $\underline{R}_c$ is a magnetic field curvature vector.

The present invention describe in the above shall not be restricted by the previously described embodiment and attached drawing, and it is clear to the persons who have usual knowledge for the corresponding technology field of present invention the diverse substitution, modification and change are available within the range not exceeding the idea and scope of present invention. Consequently, the examples of such correction or modification shall be included into the scope of patent claiming of present invention.

AVAILABILITY FOR INDUSTRIAL USE

The permanent magnet installing type antenna to create uniform and large area microwave plasma creation source of present invention is realized with the permanent magnet installing type antenna which can equip the uniformity and large area of plasma distribution concurrently by means of inserting/arraying of the permanent magnets in the antenna itself and can be a source for uniform and large area microwave plasma creation using the forced cooling type large diameter coaxial structure without an electricity-feeder.

What is claimed is:

1. A microwave antenna for creating the plasma comprising a waveguide, a main body of antenna, a coaxial structure connecting part said waveguide, said main body electrically;

wherein said main body of antenna comprising a donut shaped conductive block formed with multiple slots, notches are formed between the multiple slots of the conductive block, multiple permanent magnets are inserted into the notches.

2. The microwave antenna to create the plasma according to claim 1 wherein the multiple slots are formed by passing through internal and external part of the conductive blocks.

3. The microwave antenna to create the plasma according to claim 2 wherein the multiple slots are formed with repetitive square wave pattern.

4. The microwave antenna to create the plasma according to claim 2 wherein said multiple permanent magnets are inserted into the notches formed between the multiple slots and are aligned its upper side to be N pole and bottom side to be S pole, otherwise its upper side to be S pole and bottom side to be N pole.

5. The microwave antenna to create the plasma according to claim 2 wherein movement of the energetic electrons due to the gradient and curvature of the magnetic field is governed by the following equation, $$\underline{V}_d = \frac{m_e}{e}\left(V_\|^2 + \frac{1}{2}V_\perp^2\right)\frac{B \times R_c}{B^2 R^2}$$

Here, $\underline{V}_d$ is a vector of the drift velocity,
$V_\|$ is a velocity vector for magnetic field direction,
$V_\perp$ is a velocity which is perpendicular to the magnetic field,
$B^i$ is a magnetic field vector,
$\underline{R}_c$ is a magnetic field curvature vector.

6. The microwave antenna to create the plasma according to claim 2 wherein comprising
an internal conductive block where the coaxial structure connecting part comprising a large diameter coaxial structure;
an external conductive block allocating to the external part of said internal conductive block; and
a ceramic insulation which covers a part of the entire internal conductive block.

7. The microwave antenna to create the plasma according to claim 1 wherein said main body of antenna further comprises a cover to curb the deviation of said permanent magnet to outside.

8. The microwave antenna to create the plasma according to claim 1 wherein the multiple slots are formed with repetitive square wave pattern.

9. The microwave antenna to create the plasma according to claim 8 wherein height direction length of the conductive block and the circumferential direction length of the multiple slots are formed with ½ of the wave decided by the use frequency, the multiple slots are shorted at terminal part.

10. The microwave antenna to create the plasma according to claim 1 wherein said multiple permanent magnets are inserted into the notches formed between the multiple slots and are aligned its upper side to be N pole and bottom side to be S pole, otherwise its upper side to be S pole and bottom side to be N pole.

11. The microwave antenna to create the plasma according to claim 1 wherein the main body of antenna further comprising
a connecting part to the external conductive block and a connecting part to the internal conductive block which connect electrically to the coaxial structure connecting part in the antenna main body.

12. The microwave antenna to create the plasma according to claim 1 wherein movement of the energetic electrons due to the gradient and curvature of the magnetic field is governed by the following equation, $$\underline{V}_d = \frac{m_e}{e}\left(V_\|^2 + \frac{1}{2}V_\perp^2\right)\frac{B \times R_c}{B^2 R^2}$$

Here, $\underline{V}_d$ is a vector of the drift velocity,
$V_\|$ is a velocity vector for magnetic field direction,
$V_\perp$ is a velocity which is perpendicular to the magnetic field,
$B^i$ is a magnetic field vector,
$\underline{R}_c$ is a magnetic field curvature vector.

13. The microwave antenna to create the plasma according to claim 1 wherein comprising
an internal conductive block where the coaxial structure connecting part comprising a large diameter coaxial structure;
an external conductive block allocating to the external part of said internal conductive block; and
a ceramic insulation which covers a part of the entire internal conductive block.

14. The microwave antenna to create the plasma according to claim 13 wherein further comprising a cooling channel to cool the internal and external conductive block in the coaxial structure connecting part.

15. The microwave antenna to create the plasma according to claim 13 wherein further comprising the antenna main body connecting part in the coaxial structure connecting part.

16. The microwave antenna to create the plasma according to claim 13 wherein the internal conductive block is inserted into the waveguide and power is transmitted by coupling of the microwave inside the waveguide in coaxial structure.

* * * * *